United States Patent [19]

Knights

[11] 4,418,645
[45] Dec. 6, 1983

[54] GLOW DISCHARGE APPARATUS WITH SQUIRREL CAGE ELECTRODE

[75] Inventor: John C. Knights, Palo Alto, Calif.

[73] Assignee: Xerox Corporation, Stamford, Conn.

[21] Appl. No.: 362,343

[22] Filed: Mar. 26, 1982

[51] Int. Cl.³ ............................................ C23C 13/08
[52] U.S. Cl. .................................... 118/715; 118/723; 118/50.1; 204/164
[58] Field of Search ...................... 118/50.1, 715, 723; 204/164

[56] References Cited

U.S. PATENT DOCUMENTS 4,262,631 4/1981 Kubacki ............................ 427/39 X Primary Examiner—Michael R. Lusignan
Attorney, Agent, or Firm—Douglas W. Carothers, Jr.

[57] ABSTRACT

In an r.f. glow discharge system, a plurality of hollow electrodes are positioned circumferentially about a central point forming a circular array or squirrel cage. A workpiece is supported within the squirrel cage and relative rotational movement between the squirrel cage and the workpiece is provided. A plurality of apertures are provided along the surface of each electrode and aligned toward the surface of the workpiece. Alternatively, each electrode may further consist of a pair of inner and outer hollow tubes each with a plurality of apertures along its length with the apertures of the inner tube being adjacent to and spaced from the apertures of the outer tube but offset therefrom. The arrangement is best suited for a cylindrically shaped workpiece, e.g., a photoreceptor drum.

6 Claims, 3 Drawing Figures

GLOW DISCHARGE APPARATUS WITH SQUIRREL CAGE ELECTRODE

BACKGROUND OF THE INVENTION

This invention relates to glow discharge apparatus for deposition of films more particularly to apparatus design for film deposition on cylindrically shaped substrates, e.g., drum photoreceptor members.

Many different kinds of glow discharge apparatus have been designed for the deposition of thin films on surfaces of different shaped workpieces or substrates. Of particular interest is the deposition of amorphous silicon (a-Si) and, more particularly, a-Si:H produced during the r.f. glow discharge process. [W. E. Spear and P. G. Le Comber, *Solid State Communications,* Vol. 17, p. 1193 et seq. (1975), W. E. Spear, *Advance Physics,* Vol. 26, p. 28 et seq. (1977)]. A typical example of the glow discharge systems now employed is shown in the article of J. C. Knights entitled "Substitutional Doping in Amorphous Silicon", *AIP Conference Proceedings,* No. 31, American Institute of Physics, 1976.

An important application of a-Si:H thin films is a photoreceptor member in electrographic systems. Many such systems today require cylindrically shaped photoreceptor members. While the glow discharge system disclosed in the above-mentioned J. C. Knights article is suitable for flat plate workpieces or substrates, it is not best suited for cylindrically shaped workpieces.

SUMMARY OF THE INVENTION

According to this invention, a plurality of hollow electrodes are positioned circumferentially about a central point in an r.f. glow discharge system forming a circular array or squirrel cage. A workpiece is supported within the squirrel cage and relative rotational movement between the squirrel cage and the workpiece is provided. A plurality of apertures are provided along each electrode and aligned toward the surface of the workpiece. Each electrode may, further, consist of a pair of inner and outer hollow tubes each with a plurality of apertures along its length with the apertures of the inner tube being adjacent to and spaced from the apertures of the outer tube but offset therefrom. The squirrel cage arrangement is best suited for a cylindrically shaped workpiece.

Relative rotational movement between the squirrel cage and workpiece with the expulsion of deposition gases and appropriate dopants from the electrode apertures provides for uniformity in the presentation of deposition gases to the surface of the workpiece. The offset aperture arrangement in inner/outer hollow tube embodiment provides a labyrinth path for the expelled gases improving the uniformity of the presentation of gases to the surface of the workpiece thereby resulting in improved uniformity in composition and thickness in the deposited film.

More than one squirrel cage and workpiece arrangement may be provided in a single system.

Other objects and attainments together with a fuller understanding of the invention will become apparent and appreciated by referring to the following description and claims taken in conjunction with the accompanying drawings.

DESCRIPTION OF THE PREFERRED EMBODIMENT

Figure 1:
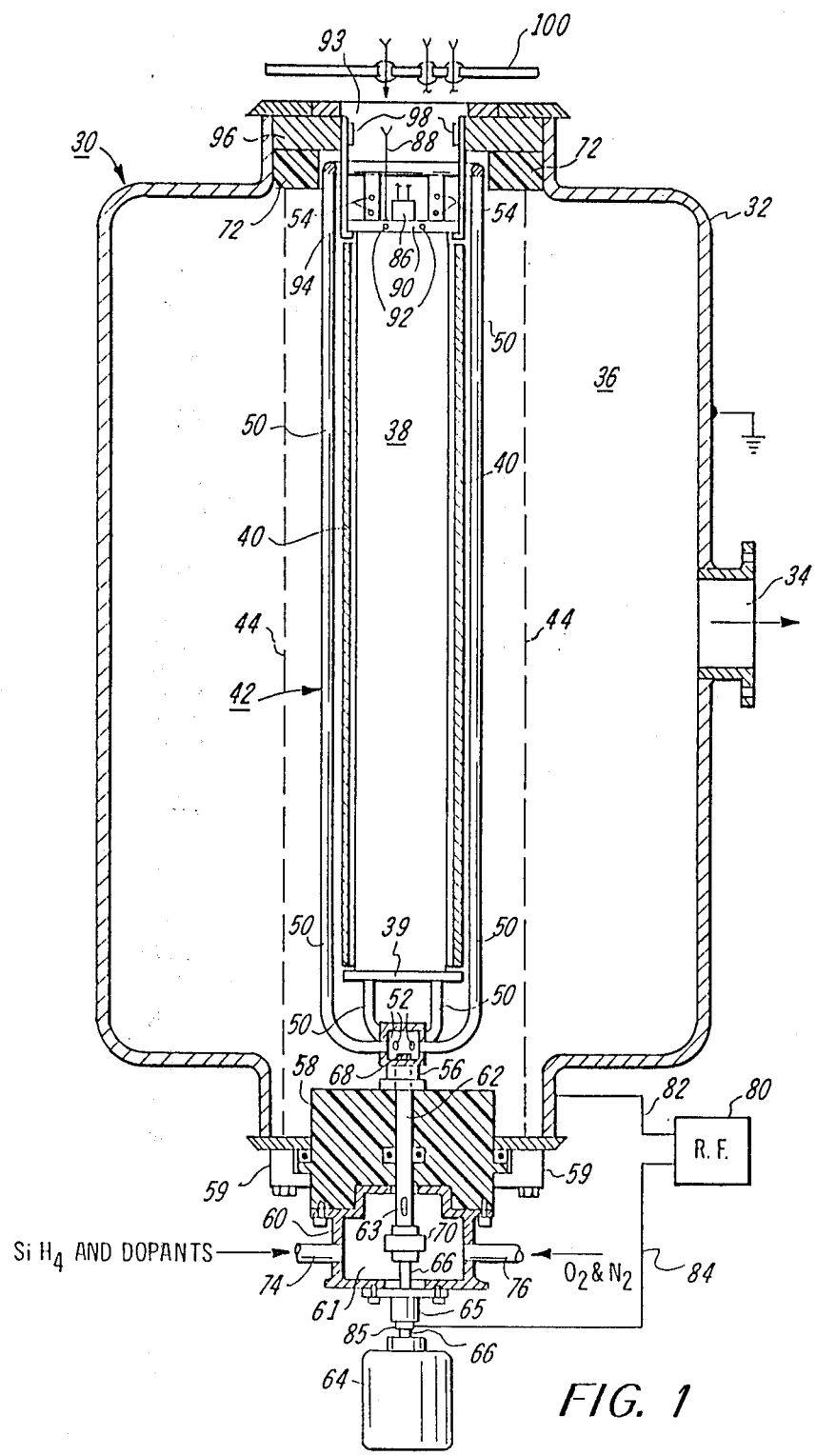
FIG. 1 is a schematic illustration of an r.f. glow discharge system with a squirrel cage electrode comprising this invention.

FIG. 1 schematically illustrates the r.f. glow discharge deposition apparatus 30 comprising this invention. Glow discharge apparatus 30 is of the capacitive type of discharge.

Apparatus 30 comprises the receptacle 32 which may be evacuated with an exhausting device (not shown) via port 34. The chamber 36 of receptacle 32 contains a support member 38 upon which the workpiece or substrate 14 is supported. Workpiece 14 may be in the form of a cylindrical member or drum 40. Drum 40 rests on the flange 39 at the bottom end of member 38. Also included in chamber 36 is a rotatable squirrel cage electrode 42 and a circular counterelectrode 44 which is electrically part of the receptacle 32. The counterelectrode 44 may be an envelope of sheeting or sheathing comprising solid sheet metal or open wire grid or screen mesh. A plasma is created between electrode 44 and squirrel cage electrode 42.

Squirrel cage electrode 42 comprises a plurality of hollow tubes 50 supported at their bottom ends by the hollow fitting 46 and at their upper ends by a ring member 48. In the embodiment shown, there are six vertical tubes 50. Each tube is coupled to fitting 46 as indicated at 52. Also, each tube has a plurality of apertures or openings 54 along its entire length with apertures 54 exposed toward the surface of drum 40.

Squirrel cage electrode 42 is supported at its lower end on bearing 56 which is supported on electrically insulating support member 58. Support member 58 is supported in receptacle 32 by suitable means 59. Gas inlet receptacle 60 is secured to the lower end of insulating member 58 by means of suitable fasteners. Tube 62 extends from chamber 61 of receptacle 60 through member 58 and is secured to bearing 56. The output of motor 64 is connected to lower electrically conductive shaft 66 which, in turn, is connected to upper electrically conductive shaft 68 via flexible and electrically conductive coupler 70. The shaft 66 is hermetically sealed relative to chamber 61 of receptacle 60 by means of a magnetic rotary shaft seal 65 manufactured and sold by Ferrofluidics Corporation of Nashua, NH. Seal 65 is secured over and seals an opening in the bottom of receptacle 60. The upper end of shaft 68 is secured to fitting 46. Motor 64, therefore, rotates squirrel cage electrode 42 at fitting 46 rotatably supported on bearing 56. The upper end of electrode 42 is supported in its rotary movement by means of the annular insulating ring 72, i.e., ring member 48 rotates within the annular confine of ring 72. Ring 72 may be made of a ceramic or plastic material such as Teflon.

Alternatively, the structure of apparatus 30 may be modified to provide rotation of drum 40 within the squirrel cage electrode 42, i.e., the drum 40 may be adapted for rotation while the squirrel cage electrode 42 is fixed to but electrically insulated from the reactor 32.

A gas inlet 74 is provided into chamber 61 of receptacle 60 for introduction of a gas for decomposition from a gas handling manifold (not shown). Examples of such gases in the case of a-Si:H deposition are $SiH_4$ or $Si_2H_6$. In such a case, the selected hydrosilicon gas may also include an impurity for doping, such as, diborane, $B_2H_6$, or phosphine $PH_3$. Another inlet 76 may be provided for the introduction of other gases for the purpose of improving the properties of the deposited layer. An example is the introduction of either O or N or a combination of these elements with the introduction of $SiH_4$ or $Si_2H_6$ to improve the photosensitivity and dark discharge properties of a deposited layer of a-Si:H. In this manner, the hydrosilicon, impurities and enhancement gases are delivered in desired proportions to the surface of drum 40 to be coated. These gases mix in chamber 61 and then proceed to the confines of the squirrel cage electrode 42 via the openings 63 in tube 62, fitting 46, tubes 50 and, thence, out the apertures 54. Improved uniformity of the deposited film relative to composition and layer thickness is brought about by relative rotation between the squirrel cage electrode 42 and drum 40 in the presence of a plasma created between electrodes 42 and 44.

The plasma created between electrodes 42 and 44 is produced from connection of these electrodes to a high frequency supply 80. The high voltage frequency of supply 80 may be 1 to 30 MHz. One lead 82 of generator 80 is connected to the receptacle 32, which includes electrode 44, while the other lead 84 of generator 80 is connected to electrode 42 via electrical commutator 85 and shafts 66 and 68.

The upper end of receptacle 32 is provided with an opening 93 from which drum support member 38 is supported. Member 38 has a hollow interior which includes a heater 86 for the full length of the member. Also, a thermocouple via electrical lead 88 is provided to monitor the temperature. Member 38 is provided with a removable ring collar 90 at its upper end. Collar 90 is secured to member 38 by means of set screws 92. Member 38 is supported in a stationary and suspended manner by means of L-shaped support arms 94 and collar 90. The upper ends of the arms 94 are supported from ring support 96 by means of releasable pins 98. Two or more arms 94 may be employed to support member 38. A suitable cover 100 is provided for hermetically sealing off chamber 36.

Apparatus 30 is set up for use in the following fashion. First, drum 40 is slipped on member 38 down to support flange 39. The drum 40, as an example, may be of Al and about 0.15 inch thick with an internal diameter of 3 inches and a length of about 15.75 inches. Next, collar 90 is placed on the top of member 38 and is secured into position by means of set screws 92. Then, member 38 with drum 40 is lowered through opening 93 into chamber 36 and the interior of the squirrel cage electrode 42. The lowering of member 38 into chamber 36 may be accomplished with arms 94. The openings in the upper ends of arms 94 are then aligned with corresponding openings in ring 96 and the pins 98 are inserted into openings provided in arms 94 and ring 96. With the necessary electrical connections made to a heater 86 and thermocouple via electrical lead 88 through lid 100, lid 100 is secured to receptacle 32 by suitable conventional means.

An example of deposition parameters for this apparatus to provide low defect density and high photoconductivity employing a hydrosilicon gas are as follows. Substrate temperature is maintained at 320° C. The net r.f. power density is 150 watts to a matching network. Gas flow rate is 100 sccm. The pressure in the chamber 36 is 130 microns.

Figure 2:
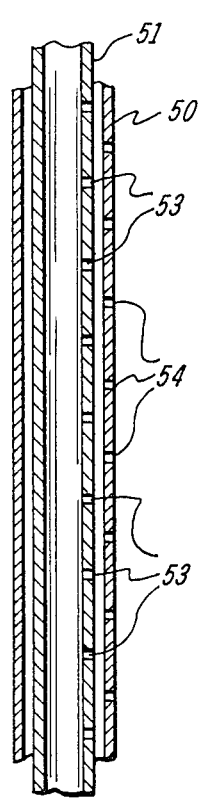
FIG. 2 is a schematic illustration of a portion of a modified form of a squirrel cage electrode.

In FIG. 2, a modified form of the squirrel cage electrode 42 is shown. The detailed construction is shown only for one electrode but is applicable to each of the several tubes comprising the squirrel cage structure. The modified form comprises two tubes, an inner tube 51 and an outer tube 50. The inner tube has a plurality of apertures 53 along its length that are laterally spaced or offset from the apertures 54 of tube 50. The gases entering the fitting 46 enter only the interior of tubes 51 and are expelled through apertures 53, thence laterally within the confines between tubes 50 and 51 and thence out of the apertures 54 toward the surface of the drum 40. The offset of apertures 53 and 54 provides a restriction on the flow of gases between the two tubes. This labyrinth path for the expelled gases improves the uniformity of the presentation of gases to the surface of drum 40 which results in improved uniformity in composition and thickness of the deposited film.

Figure 3:
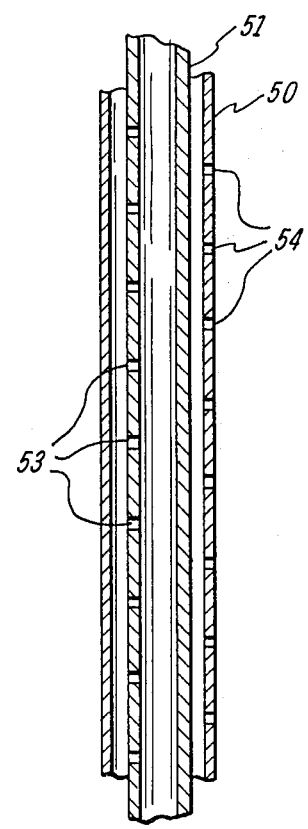
FIG. 3 is a schematic illustration of a portion of a modified form of the electrode shown in FIG. 2.

In FIG. 3, the inner tube 51 has been rotated 180° so that the aligned apertures 53 are opposite to the regions of the outer tube 50 containing aligned apertures 54. Gases expelled from apertures 53 must circulate within the confines of the region between the inner and outer tubes before being expelled from apertures 54 toward the surface of drum 40.

An example of dimensional relationships of inner and outer tubes 51 and 50 is that apertures 53 as well as apertures 54 are spaced 1 inch from each other and the clearance between the inner and outer tubes 51 and 50 is on the order of one one-thousandths of an inch.

The apparatus 30 disclosed in FIG. 1 may also be used to fabricate the single and multicomponent, multilayer photoreceptor members disclosed in U.S. patent application Ser. No. 335,654 filed Mar. 8, 1982 and employing the drum 40 as a substrate.

While the invention has been described in conjunction with specific embodiments, it is evident that many alternatives, modifications and variations will be apparent to those skilled in the art in light of the foregoing description. Accordingly, it is intended to embrace all such alternatives, modifications, and variations as fall within the spirit and scope of the appended claims.

What is claimed is:

1. In an r.f. glow discharge system, the combination comprising:

a plurality of elongated hollow electrodes positioned circumferentially about a central point forming a circular array, said array coupled to one lead of an r.f. source, means to supply reactant gases to the interior of said hollow electrodes, mounting means for supporting a workpiece within the confines of said electrode circular array, a second electrode exterior of said electrode circular array and coupled to the other lead of said r.f. source, means to provide relative rotational movement between said electrode array and said mounting means, and a plurality of apertures along the length of said array electrodes and aligned toward the surface of said workpiece for the exposure of said reactant gases toward a mounted workpiece.

2. In the r.f. glow discharge system of claim 1 wherein there is an inner hollow electrode within each of said hollow elongated electrodes, a plurality of apertures along the length of said inner electrodes.

3. In the r.f. glow discharge system of claim 2 wherein said inner electrode apertures are aligned adjacent to and spaced from said elongated electrode apertures but offset therefrom.

4. In the r.f. glow discharge system of claim 2 wherein said inner electrode apertures are aligned in opposition to said elongated electrode apertures and offset therefrom.

5. In the r.f. glow discharge system of either claim 1 or claim 2 wherein said workpiece is cylindrical shape.

6. In an r.f. glow discharge system, the combination comprising, a plurality of elongated hollow electrodes secured at one end thereof to a common fitting, said electrodes being positioned in a circle forming a squirrel cage, said squirrel cage coupled to one lead of an r.f. source, means to supply reactant gases to the interior of said hollow electrodes, mounting means for supporting a cylindrical workpiece within the confines of said squirrel cage, a second electrode exterior of said squirrel cage and coupled to the other lead of said r.f. source, operation of said r.f. source creative of a plasma between said electrodes, means to provide relative rotational movement between said squirrel cage and said mounting means, each of said electrodes comprising a pair of hollow tubes one within the other, a plurality of apertures aligned along the length of each of said tubes, the apertures of said one tube being adjacent to and spaced from the apertures of said other tube but offset therefrom, said other tube having its apertures aligned toward the center of said squirrel cage.

* * * * *